(12) United States Patent
Ordentlich et al.

(10) Patent No.: US 8,792,289 B2
(45) Date of Patent: Jul. 29, 2014

(54) REWRITING A MEMORY ARRAY

(75) Inventors: Erik Ordentlich, San Jose, CA (US); Gadiel Seroussi, Cupertino, CA (US); Pascal Olivier Vontobel, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 15 days.

(21) Appl. No.: 13/812,050

(22) PCT Filed: Jul. 28, 2010

(86) PCT No.: PCT/US2010/043543
§ 371 (c)(1),
(2), (4) Date: Jan. 24, 2013

(87) PCT Pub. No.: WO2012/015401
PCT Pub. Date: Feb. 2, 2012

(65) Prior Publication Data
US 2013/0121062 A1     May 16, 2013

(51) Int. Cl.
*G11C 7/00* (2006.01)
*G11C 11/00* (2006.01)
*G11C 7/10* (2006.01)
*G11C 13/00* (2006.01)

(52) U.S. Cl.
CPC ............. *G11C 7/10* (2013.01); *G11C 13/0002* (2013.01); *G11C 13/0069* (2013.01)
USPC ....................................... 365/189.16; 365/148

(58) Field of Classification Search
CPC .................................................... G11C 13/0069
USPC ....................................... 365/189.16
See application file for complete search history.

(56) References Cited

U.S. PATENT DOCUMENTS

| 6,047,391 | A | 4/2000 | Younis et al. | |
|---|---|---|---|---|
| 7,280,392 | B2 * | 10/2007 | Liaw et al. | 365/163 |
| 7,319,416 | B2 | 1/2008 | Robinett et al. | |
| 7,489,583 | B2 | 2/2009 | Kuekes et al. | |
| 7,508,695 | B2 * | 3/2009 | Sugita | 365/148 |
| 8,537,596 | B2 * | 9/2013 | Ordentlich et al. | 365/148 |
| 2007/0053378 | A1 | 3/2007 | Kuekes et al. | |
| 2008/0266941 | A1 | 10/2008 | Lee et al. | |
| 2009/0257267 | A1 | 10/2009 | Scheuerlein | |
| 2010/0214811 | A1 | 8/2010 | Franceschini et al. | |
| 2013/0262759 | A1 * | 10/2013 | Ordentlich et al. | 711/114 |
| 2014/0078814 | A1 * | 3/2014 | Shimakawa et al. | 365/148 |

OTHER PUBLICATIONS

International Search Report and Written Opinion of the International Searching Authority, Dated Mar. 31, 2011, PCT Application No. PCT/US2010/043543, Filed Jul. 28, 2010.

(Continued)

*Primary Examiner* — Son Mai

(57) ABSTRACT

A method for rewriting a memory array with a number of memory elements includes performing a rewrite process to change the memory array from an initial state to a target state in a manner that avoids violating a set of weight constraints at any time during the rewrite process. A memory system includes a memory array and a memory controller configured to perform a rewrite process to change the memory array from an initial state to a target state in a manner that avoids violating a set of weight constraints at any time during the rewrite process.

15 Claims, 6 Drawing Sheets

(56) References Cited

OTHER PUBLICATIONS

Lu, Chin Lung et al. "A memory-efficient algorithm for multiple sequence alignment with constraints." Bioinformatics, vol. 21, No. 1 (2005), pp. 20-30.

Vontobel, Pascal O. et al., "Writing to and reading from a nano-scale crossbar memory based on memristors", Published Sep. 25, 2009, Nanotechnology, vol. 20, No. 42, 425204.

* cited by examiner

Initial State
(300)

Column
(304)

|   | 1 | 2 | 3 | 4 | 5 |
|---|---|---|---|---|---|
| 1 | 0 | 1 | 0 | 0 | 1 |
| 2 | 0 | 0 | 1 | 0 | 1 |
| 3 | 0 | 1 | 0 | 1 | 0 |
| 4 | 1 | 0 | 0 | 1 | 0 |
| 5 | 1 | 0 | 1 | 0 | 0 |

Row (302)

Memory Array (308)

*Fig. 3A*

Target State
(306)

Column
(304)

|   | 1 | 2 | 3 | 4 | 5 |
|---|---|---|---|---|---|
| 1 | 1 | 0 | 1 | 0 | 0 |
| 2 | 1 | 0 | 0 | 1 | 0 |
| 3 | 0 | 1 | 1 | 0 | 0 |
| 4 | 0 | 0 | 0 | 0 | 1 |
| 5 | 0 | 1 | 0 | 1 | 0 |

Row (302)

Memory Array (308)

*Fig. 3B*

Intermediate State
(500)

Column
(504)

|   | 1 | 2 | 3 | 4 | 5 |
|---|---|---|---|---|---|
| 1 | 0 | 0 | 0 | 0 | 0 |
| 2 | 0 | 0 | 0 | 0 | 0 |
| 3 | 0 | 1 | 0 | 0 | 0 |
| 4 | 0 | 0 | 0 | 0 | 0 |
| 5 | 0 | 0 | 0 | 0 | 0 |

Row (502)

Memory Array (508)

*Fig. 5A*

Target State
(506)

Column
(504)

|   | 1 | 2 | 3 | 4 | 5 |
|---|---|---|---|---|---|
| 1 | 1 | 0 | 1 | 0 | 0 |
| 2 | 1 | 0 | 0 | 1 | 0 |
| 3 | 0 | 1 | 1 | 0 | 0 |
| 4 | 0 | 0 | 0 | 0 | 1 |
| 5 | 0 | 1 | 0 | 1 | 0 |

Row (502)

Memory Array (508)

*Fig. 5B*

```
600
```

Rewrite a memory array from an initial state to a target state in a manner that avoids violating a set of weight constraints associated with the memory array (block 602)

Is initial state available to the memory controller? (decision 604)

NO → Scan through each of a number of memory elements of the memory array and for each of the number of memory elements, setting that memory element to a high resistive state if a target state for that memory element is the high resistive state (block 606)

↓

Scan through each of the number of memory elements of the memory array and for each of the number of memory elements, setting that memory element to a low resistive state if a target state for that memory element is the low resistive state (block 608)

YES → Scan through each of a number of memory elements of the memory array and for each of the number of memory elements, setting that memory element to a high resistive state if an initial state for that memory element is in a low resistive state and a target state for that memory element is a high resistive state (block 610)

↓

Scan through each of the number of memory elements of the memory array and for each of the number of memory elements, setting that memory element to the low resistive state if an initial state for that memory element is in the high resistive state and a target state for that memory element is the low resistive state (block 612)

*Fig. 6*

REWRITING A MEMORY ARRAY

CROSS-REFERENCE TO RELATED APPLICATION

This application is a U.S. National Stage Application of and claims priority to International Patent Application No. PCT/US2010/043543, filed on Jul. 28, 2010, and entitled "REWRITING A MEMORY ARRAY."

BACKGROUND

Electronic data is typically represented using a binary number system. The binary number system is one in which values may take on one of two states, typically represented by a "1" and a "0". Various types of memory systems have been developed which include small programmable devices that store a single bit as either a "1" or a "0". For example, a transistor may be used as a switch which is either in an ON state or an OFF state. The ON state may be used to represent a "1" while the OFF state may be used to represent a "0".

One type of memory architecture is the crossbar memory architecture. The crossbar architecture includes two sets of interconnecting wire segments. A memory element is placed at each crosspoint between each wire segment. In one example, crossbar architecture may employ memristors as memory elements. A memristor is a device which is able to change the value of its resistance in response to various programming conditions. A memristor may represent a "1" while in a low resistance state and a "0" while in a high resistance state.

When resistance based memory elements such as memristors are placed in a crossbar architecture, it may be desirable to limit the number of memory elements in a low resistive state along a particular wire segment of the crossbar architecture. Having too many memory elements in a low resistive state along a particular wire segment may allow too much electric current to pass through. Too much electric current passing through the wire segments may potentially interfere with read/write operations and can also damage the wire segments and other components of the read/write circuitry.

The data stored on a memory array can be encoded so that the number of memory elements in a low resistive state along a particular wire segment is appropriately limited. However, during the process of rewriting the memory array, these weight constraints may be violated.

BRIEF DESCRIPTION OF THE DRAWINGS

The accompanying drawings illustrate various embodiments of the principles described herein and are a part of the specification. The illustrated embodiments are merely examples and do not limit the scope of the claims.

FIG. 3A is a diagram showing an illustrative initial state of a memory array, according to one example of principles described herein.

FIG. 3B is a diagram showing an illustrative target state of a memory array, according to one example of principles described herein.

FIG. 5A is a diagram showing an illustrative memory array in an intermediate state after one stage of a rewriting process has been performed, according to one example of principles described herein.

FIG. 5B is a diagram showing an illustrative memory array in a final state after the last stage of a rewriting process has been performed, according to one example of principles described herein.

FIG. 6 is a flowchart showing an illustrative method for rewriting a memory array, according to one example of principles described herein.

Throughout the drawings, identical reference numbers designate similar, but not necessarily identical, elements.

DETAILED DESCRIPTION

Figure 1:
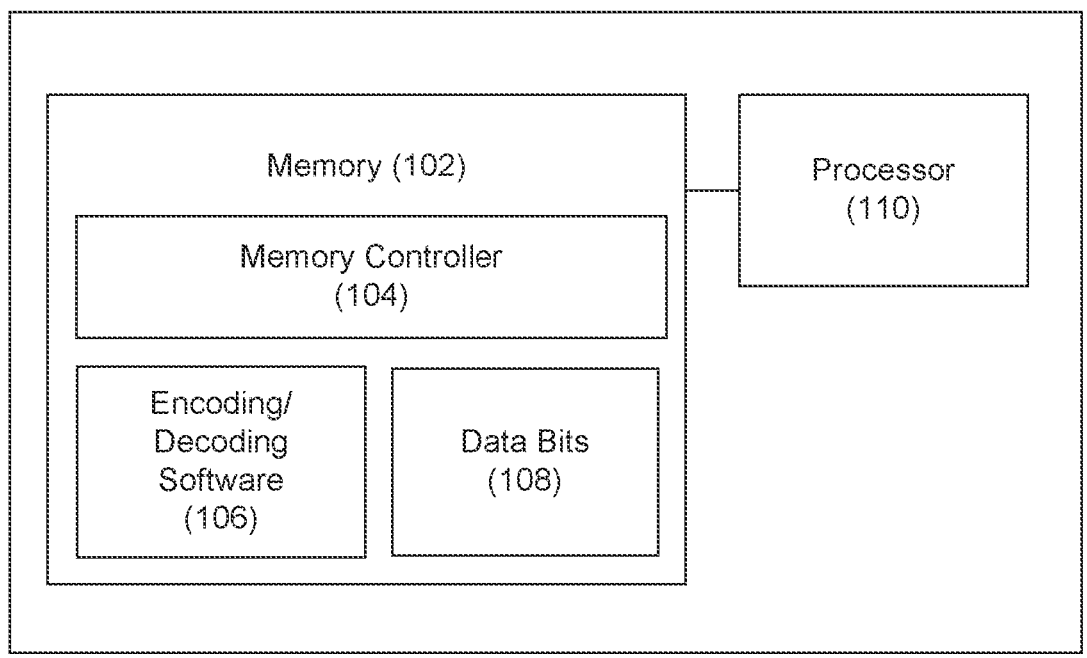
FIG. 1 is a diagram showing an illustrative physical computing system, according to one example of principles described herein.

As mentioned above, when resistive based memory elements such as memristors are placed in a crossbar architecture, it may be desirable to limit the number of memory elements in a low resistive state along a particular wire segment of the crossbar architecture. Having too many memory elements in a low resistive state along a particular wire segment may allow too much electric current to pass through. Too much electric current passing through the wire segments may potentially interfere with read/write operations and may also damage the wire segments and other components of the read/write circuitry.

The data stored on a memory array can be encoded so that the number of memory elements in a low resistive state along a particular wire segment is appropriately limited. However, during the process of rewriting the memory array, these weight constraints may be violated.

One solution is to scan through an entire memory array and set each memory element within the memory array to a high resistive state. The process can then continue by scanning through the entire memory array and setting each memory element to either a high resistive state or a low resistive state depending on the data to be stored in the memory array. Although this method prevents weight constraints from being violated during the rewrite process, it requires that the entire memory array be scanned through twice. This takes additional time and consumes additional power.

In light of this and other issues, the present specification discloses efficient methods for rewriting a memory array so that given weight constraints are not violated at any time during the rewrite process. This is done by dividing the rewrite process into two stages. The first stage involves setting the appropriate memory elements to a high resistive state and the second stage involves setting the memory elements to a low resistive state. Methods embodying principles described herein will ensure that during any period during the transition from an initial state to a target state of a memory array, given weight constraints are not violated.

Throughout this specification and in the appended claims, the term "initial state" refers to the state of a memory element or group of memory elements within a memory array before a rewriting process begins. The term "target state" refers to the state which a memory element or group of memory elements will be in after the rewriting process has finished.

According to one illustrative example, the method for rewriting the memory array includes scanning through each memory element in two stages. During the first stage, if the target state for a particular memory element is a high resistive state, then that particular memory element will be rewritten to the high resistive state. After this first stage, fewer memory elements will be in a low resistive state than were in the initial state. Due to whatever coding process is used, the initial state will be such that the constraints relating to how many memory elements can be in a low resistive state are not violated. Therefore, reducing the number of memory elements in a low resistive state will certainly not violate these constraints.

During the second stage, a second scan through each memory element is made. During the second scan, if the target state for a particular memory element is a low resistive state, then that particular memory element is rewritten to the low resistive state. After the second stage, the memory array will be in its target state. Because the target state is also encoded by whatever coding process is used to prevent violation of the weight constraints, the state of the array during and after the rewriting process will not violate the weight constraints. Using this method, the number of writes performed will be equal to the number of memory elements within the memory array.

The above described method does not require knowledge of the initial state of the memory array. However, in some cases, the memory controller maintains knowledge of the initial state of the memory array. In a further example, in the case that the memory controller maintains knowledge of the initial state of the memory array, the method for rewriting the memory array also includes two scanning stages. During the first scanning stage, if the target state for a particular memory element is a high resistive state and the initial state of that memory element is a low resistive state, then that memory element is rewritten to a high resistive state.

During the second scanning stage, if the target state for a particular memory element is a low resistive state and the initial state of that memory element is in a high resistive state, then that memory element is rewritten to the low resistive state. In this manner, the number of writes may be less than the total number of memory elements within the memory array. This is because a rewrite occurs only if there is a change between the initial state of a memory element and the target state of that memory element. As with the previously described example, switching the low resistive states to the high resistive states before switching the high resistive states to the low resistive states ensures that weight constraints are not violated at any time during the writing process.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example," or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

Referring now to the figures, FIG. 1 is a diagram showing an illustrative physical computing system (100). According to certain illustrative embodiments, a physical computing system (100) may be used to encode the bits which are to be stored in a crossbar memory structure. A physical computing system (100) may include a processor (110) and a memory (102) having a memory controller (104). The memory (102) has encoding and decoding software (106) and data bits (108) stored thereon.

The physical computing system (100) may be embodied as several different types of computing devices including, but not limited to, a server, a laptop computer, a desktop computer, or a Personal Digital Assistant (PDA), or a general processing device. In some embodiments, the physical computing system may be a piece of hardware designed specifically for encoding or decoding bits. According to a number of frameworks, the system may be distributed geographically. For example, the user interface may be running on a client computer with the memory and processor running on a server computer. The physical computing system (100) may include a form of memory (102) including, but not limited to, a magnetic disk drive, a solid state drive, and/or an optical disc drive.

A memory controller (104) is a digital circuit which manages the flow of data to and from the memory (102). In some cases, a memory controller (104) is integrated with the memory (102) while in some cases the memory controller is separate from the memory (102).

The encoding software (106) stored by the memory (102) may be embodied as a computer readable code configured to cause a processor (110) to execute various instructions related to encoding data bits (108) to be stored on a crossbar memory structure.

Figure 2:
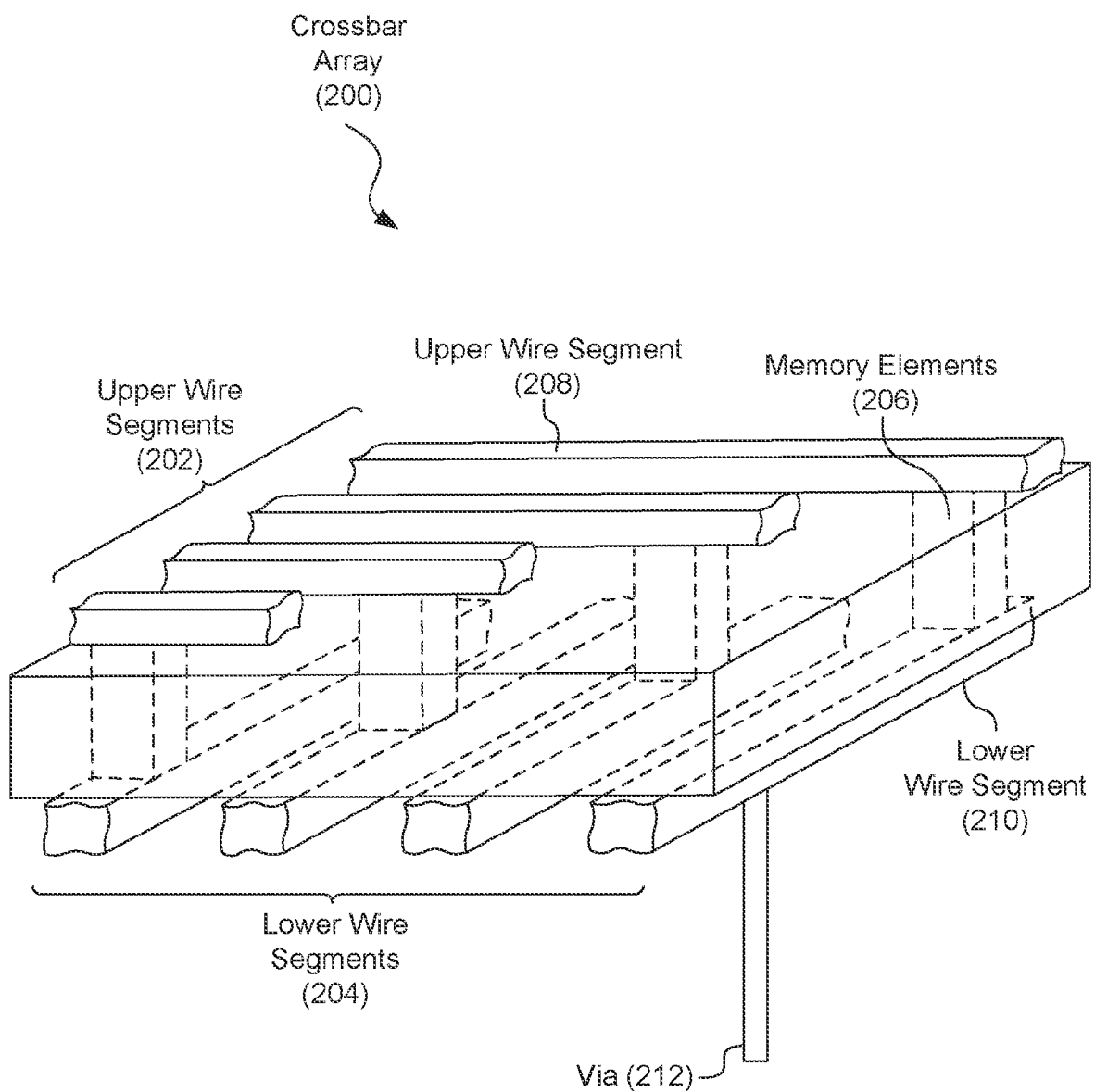
FIG. 2 is a diagram showing an illustrative crossbar memory array, according to one example of principles described herein.

FIG. 2 is a diagram showing an illustrative crossbar memory array (200). According to certain illustrative examples, the crossbar array (200) includes an upper set of wire segments (202) which are generally in parallel. Additionally, a lower set of wire segments (204) is generally perpendicular to, and intersects, the upper lines (202). Programmable memory elements (206) are placed at the intersections between an upper wire segment (208) and a lower wire segment (210).

According to certain illustrative examples, the programmable memory elements (206) may be memristive devices. Memristive devices exhibit a "memory" of past electrical conditions. For example, a memristive device may include a matrix material which contains mobile dopants. These dopants can be moved within a matrix to dynamically alter the electrical operation of the memristive device.

The motion of dopants can be induced by the application of a programming condition such as an applied electrical voltage across a suitable matrix. The programming voltage generates a relatively high electrical field through the memristive matrix and alters the distribution of dopants. After removal of the electrical field, the location and characteristics of the dopants remain stable until the application of another programming electrical field. For example, by changing the dopant configurations within a memristive matrix, the electrical resistance of the device may be altered. The memristive device is read by applying a lower reading voltage which allows the internal electrical resistance of the memristive device to be sensed but does not generate a high enough electrical field to cause significant dopant motion. Consequently, the state of the memristive device may remain stable over long time periods and through multiple read cycles.

According to certain illustrative examples, the crossbar array (200) may be used to form a non-volatile memory array. Each of the programmable memory elements (206) is used to represent one or more bits of data. Although individual wire segments (208, 210) in FIG. 2 are shown with rectangular cross sections, crossbars may also have square, circular, elliptical, or more complex cross sections. The lines may also have many different widths, diameters, aspect ratios and/or eccentricities. The crossbars may be nanowires, sub-microscale wires, microscale wires, or wires with larger dimensions.

According to certain illustrative examples, the crossbar architecture (200) may be integrated into a Complimentary Metal-Oxide-Semiconductor (CMOS) circuit or other conventional computer circuitry. Each individual wire segment may be connected to the CMOS circuitry by a via (212). The via (212) may be embodied as an electrically conductive path through the various substrate materials used in manufacturing the crossbar architecture. This CMOS circuitry can provide additional functionality to the memristive device such as input/output functions, buffering, logic, configuration, or other functionality. Multiple crossbar arrays can be formed over the CMOS circuitry to create a multilayer circuit.

FIG. 3A is a diagram showing an illustrative initial state (300) of a memory array (308). In the examples which will be shown throughout this specification, a 5×5 memory array (308) will be used to illustrate the principles associated with methods and systems described herein. However, the principles described herein will also apply to larger memory arrays (308).

FIG. 3A illustrates a memory array (308) that includes five rows (302) and five columns (304). The rows (302) are labeled 1-5 and the columns (304) are labeled 1-5. The rows (302) and columns (304) respectively may correspond to upper wire segments (e.g. 202, FIG. 2) and lower wire segments (e.g. 204, FIG. 2).

The ones and zeros illustrated within the 5×5 memory array (308) represent the data stored by the memory elements within the memory array (308). In this example, a digital '1' represents a low resistive state and a digital '0' represents a high resistive state. As mentioned above, it is desirable to limit the number of memory elements which are in a low resistive state along a particular wire segment. For example, a constraint may be that no more than a fraction, such as a half, of the memory elements along a particular wire segment should be in a low resistive state. Thus, no row (302) or column (304) should store more than two '1's. This limitation will be referred to as the weight constraint.

As mentioned above, various coding functions can be used to place data in a format so that when written to a memory array (308), the given weight constraints are not violated. Thus, the initial state (300) of the memory array (308) is in a state in which no weight constraints are violated. The manner in which the coding functions encode the data to satisfy the weight constraints is beyond the scope of the present specification. Thus, a detailed description of such coding methods will not be given.

During normal operation of a memory array (308), the memory array is rewritten as data is consistently being updated. Rewriting a memory array is typically done by simply overwriting the old data with the new data. When using a memory array which has weight constraints, new data will also be coded so that those weight constraints will not be violated.

FIG. 3B is a diagram showing an illustrative target state (306) of a memory array (308). The target state (306) of a memory array (308) is the state in which all memory elements of the memory array (308) will be storing the new data intended to overwrite the old data. A memory array generally does not operate by changing the state of each memory element simultaneously. Rather, the writing circuitry scans through the memory array and rewrites each memory element or a set of memory elements individually. During this rewriting process, it is possible that the weight constraints may be violated. Violating the weight constraints can damage the write circuitry or adversely affect the performance of the writing circuitry.

Figure 4:
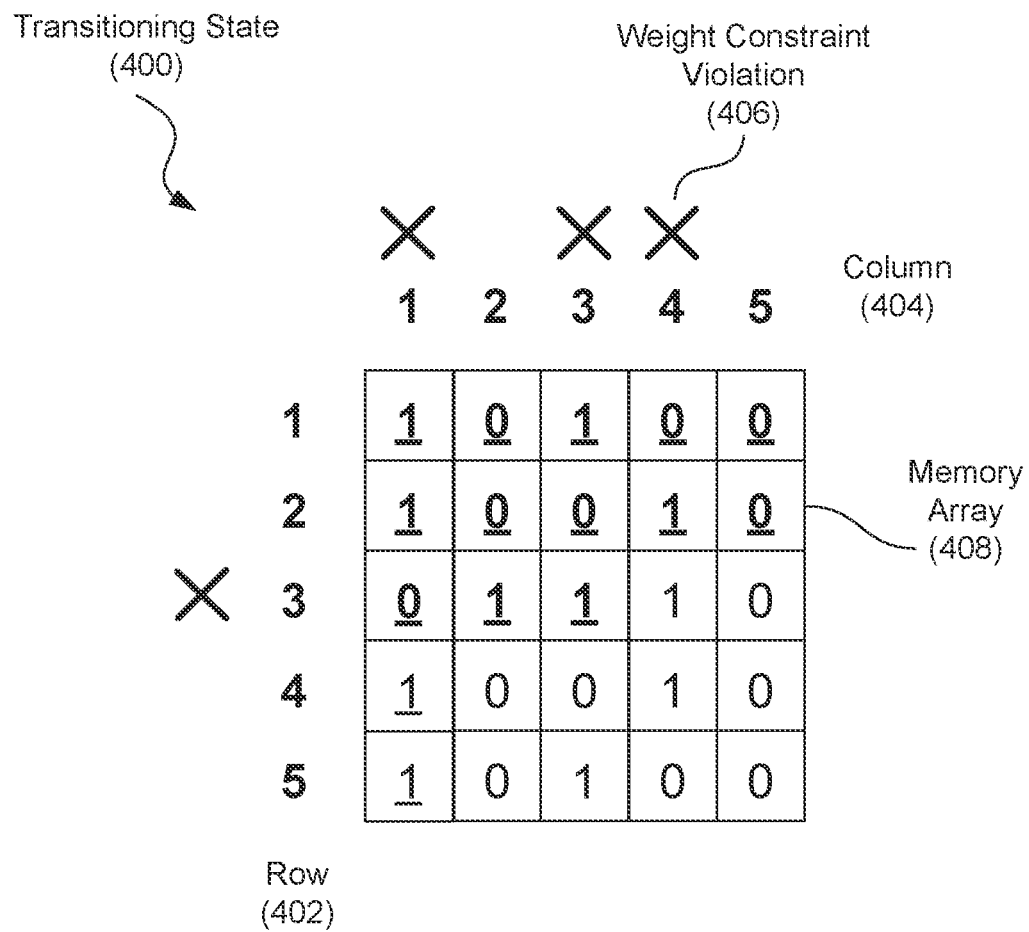
FIG. 4 is a diagram showing an illustrative memory array in a transitioning state, according to one example of principles described herein.

FIG. 4 is a diagram showing an illustrative memory array (408) in a transitioning state (400). FIG. 4 illustrates the 5×5 memory array (408) of FIG. 3 as it is transitioning from the initial state of FIG. 3A to the target state of FIG. 3B. The order in which the memory elements may be rewritten may vary. One order which may be used is referred to as the raster scan order. With a raster scan order, the memory elements are scanned sequentially through each column of each row. For example, the scan order starts with the first row and progresses through each column (404). After completion of the first row, the scan continues on the second row and scans through each column (404) of the second row. This process continues until all rows (402) have been scanned.

When transitioning between the initial state of FIG. 3A and the target state of FIG. 3B using a raster scan order, there will be periods when one or more weight constraints are violated. The point within the transition between the initial state and the target state is illustrated by the bolded and underlined '1's and '0's representing the data which has already been rewritten. The non-bolded and non-underlined '1's and '0's represent the data which has yet to be rewritten. FIG. 4 marks the rows (402) and columns (404) which have weight constraint violations (406) at the illustrated point in the transition process. To avoid such weight constraint violations, the present specification discloses a method of rewriting the memory array (408) so that no weight constraints are violated during the rewrite process.

As mentioned above, one way to rewrite the memory array (408) such that weight constraints are not violated is to scan through each memory element in two stages. During the first stage, if the target state for a particular memory element is a high resistive state, then that particular memory element will be rewritten to a high resistive state.

FIG. 5A is a diagram showing an illustrative memory array (508) in an intermediate state after the first stage of the rewriting process has been performed. During and after this first stage, fewer memory elements will store a digital '1' compared to the number of memory elements that stored a digital '1' in the initial state (e.g. 300, FIG. 3A). Because the initial state is such that the constraints regarding how many memory elements can store a digital '1' are not violated, any intermediate state as well as the final state (e.g., 500) during the first stage of the rewriting process will also not violate these constraints. Each row (502) and each column (504) will satisfy the given weight constraint FIG. 5B is a diagram showing an illustrative memory array (508) in a final state after the second stage of a rewriting process has been performed. During the second stage, a second scan through each memory element is made. During the second scan, if the target state for a particular memory element is a low resistive state, then that particular memory element is rewritten to the low resistive state. After the second stage, the memory array (508) will be in its target state. Because the target state is also encoded by whatever coding process is used to prevent violation of the weight constraints, the state of the array during and after the rewriting process will not violate the weight constraints.

Using this method, the number of writes performed will be equal to the number of memory elements within the memory array (508). Specifically, all the digital '0's of the target state will be written during the first stage and all the digital '1's of the target state will be written during the second stage.

The previously described method for rewriting a memory array (508) does not require that the initial state of the memory array (508) be known. In some cases, the memory controller (e.g. 104, FIG. 1) for the memory array (508) will be aware of the initial state of the memory array (508). In this case, the method for rewriting the memory array (508) may use the knowledge of the initial state to transition between the initial state and the target state with fewer write operations.

According to one illustrative example, this method for rewriting the memory array (508) also includes two scanning stages. During the first scanning stage, if the target state for a particular memory element is a high resistive state and the initial state of that memory element is a low resistive state, then that memory element is rewritten to a high resistive state. Thus, both the initial state and the target state for each memory element are tested. Only the memory elements which change between the initial state and the target state will be rewritten. FIG. 5A illustrates the memory elements which will change during this stage with a bolded '0'.

During the second scanning stage, if the target state for a particular memory element is a low resistive state and the initial state of that memory element is in a high resistive state, then that memory element is rewritten to the low resistive state. FIG. 5B illustrates the memory elements which will be rewritten during this stage with a bolded '1'.

Through use of this method, the number of writes may be less than the total number of memory elements within the memory array (508). In this example, only 17 rewrites take place. This is because a rewrite occurs only if there is a change between the initial state of a memory element and the target state of that memory element. As with the previously described example, switching the low resistive states to the high resistive states before switching the high resistive states to the low resistive states ensures that weight constraints are not violated.

In some cases, the order in which the memory elements are scanned may be optimized so that the overall power consumption is reduced. These orders may be applied to both stages of a rewrite operation. In some cases, different scan orders may be used for different stages to further optimize power efficiency.

For example, when changing memory elements from a high resistive state to a low resistive state, the power consumption can be reduced by the following scan order. This scan order is for the case where the voltage sources used to rewrite memory elements are closest to the first row and the first column. First, the memory elements in the first row are rewritten, and then the memory elements in the first column are rewritten. Next, the memory elements in the second row are rewritten, except for the memory element in the first column which has already been rewritten. Then, the memory elements within the second column are rewritten, except for the memory element in the first row which has already been rewritten. This process continues through each row and each column of the memory array. When changing memory elements from a low resistive state to a high resistive state, then the scan order can be the reverse of the order described above.

FIG. 6 is a flowchart showing an illustrative method (600) for rewriting a memory array. According to certain illustrative examples, the method includes rewriting (block 602) a memory array from an initial state to a target state in a manner that avoids violating a set of weight constraints associated with the memory array. To rewrite the memory array, the method may determine (decision 604) whether or not the initial state of the memory array is available in the memory controller.

If the initial state of the memory array is not (decision 604, NO) available in the memory controller, then the method continues by scanning (block 606) through each of a number of memory elements of the memory array and for each of the number of memory elements, setting that memory element to a high resistive state if a target state for that memory element is the high resistive state; and scanning (block 608) through each of the number of memory elements of the memory array and for each of the number of memory elements, setting that memory element to a low resistive state if a target state for that memory element is the low resistive state.

If the initial state of the memory array is (decision 604, YES) available in the memory controller, then the method continues by scanning (block 610) through each of a number of memory elements of the memory array and for each of the number of memory elements, setting that memory element to a high resistive state if an initial state for that memory element is in a low resistive state and a target state for that memory element is a high resistive state; and scanning (block 612) through each of the number of memory elements of the memory array and for each of the number of memory elements, setting that memory element to the low resistive state if an initial state for that memory element is in the high resistive state and a target state for that memory element is the low resistive state.

In conclusion, the present specification discloses methods and systems for rewriting a memory array so that given weight constraints are not violated. This is done by dividing the rewrite process into two stages. The first stage involves setting the appropriate memory elements to a high resistive state and the second stage involves setting the memory elements to a low resistive state. Methods and systems embodying principles described herein will ensure that during any period during the transition from an initial state to a target state of a memory array, given weight constraints are not violated.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A method for rewriting a memory array comprising a number of memory elements, the method comprising;
    performing a rewrite process to change said memory array from an initial state to a target state in a manner that avoids violating a set of weight constraints at any time during said rewrite process.

2. The method of claim 1, in which rewriting said memory array comprises:
    scanning through each of a number of memory elements of said memory array and, for each of said number of memory elements, setting that memory element to a first state if a target state for that memory element is said first state; and
    scanning through each of said number of memory elements of said memory array and, for each of said number of memory elements, setting that memory element to a second state if a target state for that memory element is said second state.

3. The method of claim 1, in which rewriting said memory array comprises:
    scanning through each of a number of memory elements of said memory array and for each of said number of memory elements, setting that memory element to a first state if an initial state for that memory element is in a second state and a target state for that memory element is a first state; and
    scanning through each of said number of memory elements of said memory array and for each of said number of memory elements, setting that memory element to said second state if an initial state for that memory element is in said first state and a target state for that memory element is said second state.

4. The method of claim 1, in which said memory elements are memristive memory elements.

5. The method of claim 1, in which said memory elements are rewritten in a specified order to reduce power consumption.

6. The method of claim 1, in which at least one of said weight constraints is that less than a fraction of said memory elements along a wire segment are allowed to be in a low resistive state.

7. A memory system comprising:
a memory array; and
a memory controller configured to:
perform a rewrite process to change said memory array from an initial state to a target state in a manner that avoids violating a set of weight constraints at any point during said rewrite process.

8. The system of claim 7, in which said memory controller is configured to:
Scan through each of a number of memory elements of said memory array and for each of said number of memory elements, setting that memory element to a high resistive state if a target state for that memory element is said high resistive state; and
scan through each of said number of memory elements of said memory array and for each of said number of memory elements, setting that memory element to a low resistive state if a target state for that memory element is said low resistive state.

9. The system of claim 7, in which said memory controller is configured to:
scan through each of a number of memory elements of said memory array and for each of said number of memory elements, setting that memory element to a high resistive state if an initial state for that memory element is in a low resistive state and a target state for that memory element is a high resistive state; and
scan through each of said number of memory elements of said memory array and for each of said number of memory elements, setting that memory element to said low resistive state if an initial state for that memory element is in said high resistive state and a target state for that memory element is said low resistive state.

10. The system of claim 7, in which said initial state of said memory array is available in said memory controller.

11. The system of claim 7, in which said memory elements are memristive memory elements.

12. The system of claim 7, in which said memory elements are rewritten in a specified order to reduce power consumption.

13. The system of claim 7, in which at least one of said weight constraints is that less than a fraction of said memory elements along a wire segment are allowed to be in a low resistive state.

14. A method for rewriting a memory array comprising a number of memory elements, the method comprising;
scanning through each of said number of memory elements of said memory array and, for each of said number of memory elements, setting that memory element to a high resistive state if an initial state for that memory element is in a low resistive state and a target state for that memory element is a high resistive state; and
scanning through each of said number of memory elements of said memory array and, for each of said number of memory elements, setting that memory element to said low resistive state if an initial state for that memory element is in said high resistive state and a target state for that memory element is said low resistive state.

15. The method of claim 14, in which said memory elements are memristive memory elements.

* * * * *

UNITED STATES PATENT AND TRADEMARK OFFICE
CERTIFICATE OF CORRECTION

PATENT NO. : 8,792,289 B2  
APPLICATION NO. : 13/812050  
DATED : July 29, 2014  
INVENTOR(S) : Erik Ordentlich et al.

Page 1 of 1

It is certified that error appears in the above-identified patent and that said Letters Patent is hereby corrected as shown below:

In the Claims

In column 9, line 22, in Claim 8, delete "Scan" and insert -- scan --, therefor.

Signed and Sealed this  
Sixth Day of January, 2015

Michelle K. Lee  
*Deputy Director of the United States Patent and Trademark Office*